(12) United States Patent
Kawashima et al.

(10) Patent No.: US 10,886,207 B2
(45) Date of Patent: Jan. 5, 2021

(54) SEMICONDUCTOR DEVICE

(71) Applicant: DENSO CORPORATION, Kariya (JP)

(72) Inventors: Takanori Kawashima, Anjo (JP); Hitoshi Ozaki, Toyota (JP); Takuya Isomura, Aichi-gun (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/383,746

(22) Filed: Apr. 15, 2019

(65) Prior Publication Data

US 2019/0355653 A1 Nov. 21, 2019

(30) Foreign Application Priority Data

May 15, 2018 (JP) .................................. 2018-093960

(51) Int. Cl.
*H01L 23/498* (2006.01)
*H01L 23/482* (2006.01)
(Continued)

(52) U.S. Cl.
CPC .... *H01L 23/49811* (2013.01); *H01L 23/3121* (2013.01); *H01L 23/4822* (2013.01); *H01L 24/49* (2013.01); *H01L 25/072* (2013.01)

(58) Field of Classification Search
CPC ......... H01L 23/49575; H01L 23/49562; H01L 23/49537; H01L 23/49811; H01L 23/3121; H01L 23/3735; H01L 23/3107; H01L 23/4334; H01L 2924/00014; H01L 24/73; H01L 24/33; H01L 24/32; H01L 2224/73265; H01L 2224/48247; H01L 2224/32245; H01L 2224/49171; H01L 2224/83801; H01L 23/4822; H01L 24/49; H01L 25/072

See application file for complete search history.

(56) References Cited

U.S. PATENT DOCUMENTS

2011/0069132 A1 3/2011 Ohno
2019/0333909 A1* 10/2019 Sugita ..................... H01L 25/18

FOREIGN PATENT DOCUMENTS

JP 2008-270293 A 11/2008
JP 2011-63003 A 3/2011
(Continued)

*Primary Examiner* — Jasmine J Clark
(74) *Attorney, Agent, or Firm* — Oliff PLC

(57) ABSTRACT

A semiconductor device may be provided with a first semiconductor element including a plurality of signal electrodes, a second semiconductor element including a plurality of signal electrodes, an encapsulant encapsulating the first semiconductor element and the second semiconductor element, and a plurality of signal terminals protruding from the encapsulant. The plurality of signal terminals may include a first signal terminal, a second signal terminal and a common signal terminal. The first signal terminal may be connected with one of the signal electrodes of the first semiconductor element within the encapsulant. The second signal terminal may be connected with one of the signal electrodes of the second semiconductor element within the encapsulant. The common signal terminal may be, within the encapsulant, connected with another one of the signal electrodes of the first semiconductor element and another one of the signal electrodes of the second semiconductor element.

10 Claims, 11 Drawing Sheets

(51) Int. Cl.
    *H01L 23/31*           (2006.01)
    *H01L 23/00*           (2006.01)
    *H01L 25/07*           (2006.01)

(56)         References Cited

FOREIGN PATENT DOCUMENTS

| JP | 2015-122876 A | 7/2015 |
| JP | 2017-147316 A | 8/2017 |

\* cited by examiner

SEMICONDUCTOR DEVICE

CROSS-REFERENCE

This application claims priority to Japanese Patent Application No. 2018-093960, filed on May 15, 2018, the entire contents of which are incorporated herein by reference.

TECHNICAL FIELD

A technology disclosed herein relates to a semiconductor device including a plurality of semiconductor elements.

BACKGROUND

Japanese Patent Application Publication No. 2017-147316 describes a semiconductor device. This semiconductor device includes a plurality of semiconductor elements disposed in an encapsulant, and a plurality of signal terminals extending over inside and outside of the encapsulant. Each of the semiconductor elements is provided with a plurality of signal electrodes, and each of the signal electrodes is connected with corresponding one of the signal terminals.

SUMMARY

A conventional semiconductor device requires signal terminals as many as the number of signal electrodes. In a semiconductor device that includes a plurality of semiconductor elements, a total number of signal electrodes is large, and hence a large number of signal terminals is required accordingly. Here, the plurality of signal terminals is connected with an external connector and the like, and thus needs to be arranged with predetermined intervals. In view of this, the semiconductor device that includes the large number of signal terminals needs to be increased in size to arrange the signal terminals. The disclosure herein provides a technology capable of reducing a number of signal terminals required in a semiconductor device that includes a plurality of semiconductor elements.

A semiconductor device disclosed herein may comprise: a first semiconductor element comprising a plurality of signal electrodes; a second semiconductor element comprising a plurality of signal electrodes; an encapsulant encapsulating the first semiconductor element and the second semiconductor element; and a plurality of signal terminals protruding from the encapsulant. The plurality of signal terminals may comprise a first signal terminal, a second signal terminal and a common signal terminal. The first signal terminal may be connected with one of the signal electrodes of the first semiconductor element within the encapsulant. The second signal terminal may be connected with one of the signal electrodes of the second semiconductor element within the encapsulant. The common signal terminal may be, within the encapsulant, connected with another one of the signal electrodes of the first semiconductor element and another one of the signal electrodes of the second semiconductor element.

In the semiconductor device above, the plurality of signal terminals includes the common signal terminal connected with both one of the signal electrodes of the first semiconductor element and one of the signal electrodes of the second semiconductor element. Such a configuration can reduce a number of required signal terminals relative to a total number of the signal electrodes included in the plurality of semiconductor elements. Here, in order to minimize the number of the signal terminals, it can be considered to replace all of the plurality of signal terminals with the common signal terminals that are shared among the plurality of semiconductor elements. However, replacing all of the plurality of signal terminals with the common signal terminals makes it impossible to individually communicate with the respective semiconductor elements. In view of this, in the semiconductor device above, the plurality of signal terminals further includes the first signal terminal connected only with another one of the signal electrodes of the first semiconductor element, and the second signal terminal connected only with another one of the signal electrodes of the second semiconductor element. Due to this, the number of required signal terminals can be reduced as a whole, while individual communication paths to the respective semiconductor elements are maintained.

DETAILED DESCRIPTION

Figure 1:
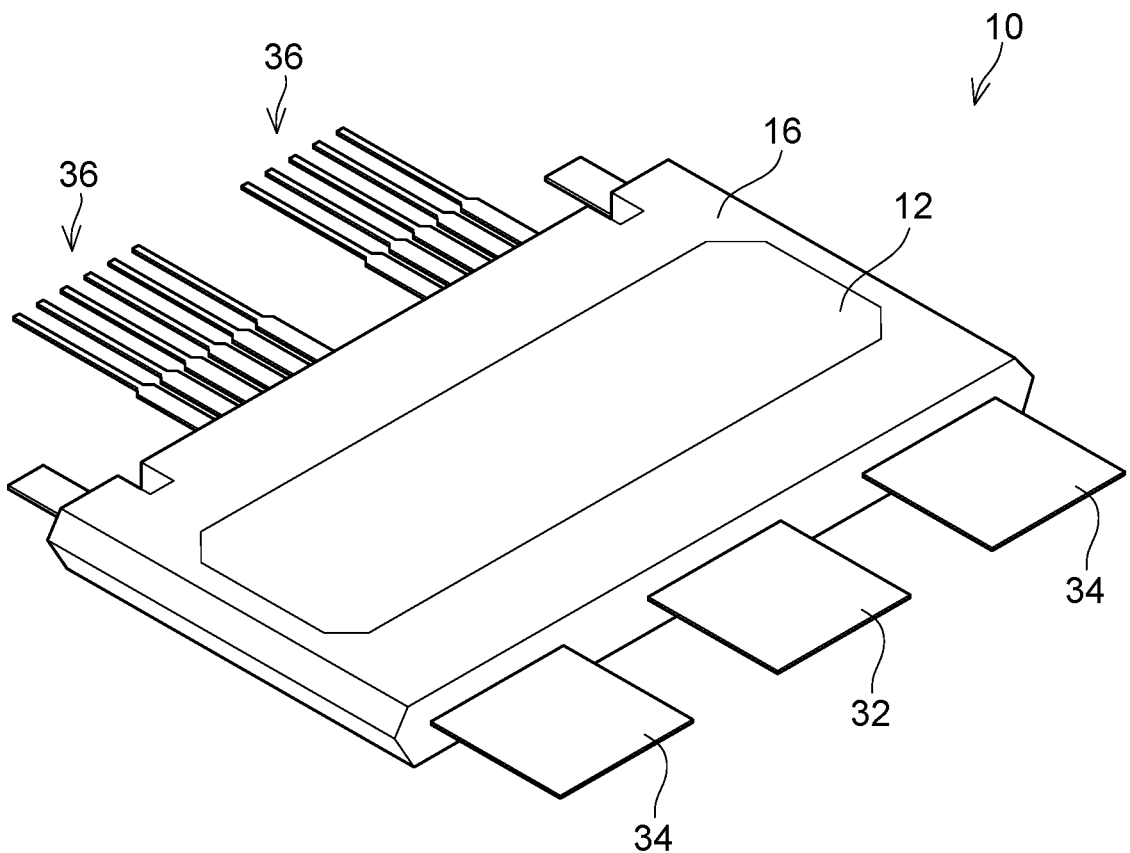
FIG. 1 is an external view of a semiconductor device 10.
Figure 2:
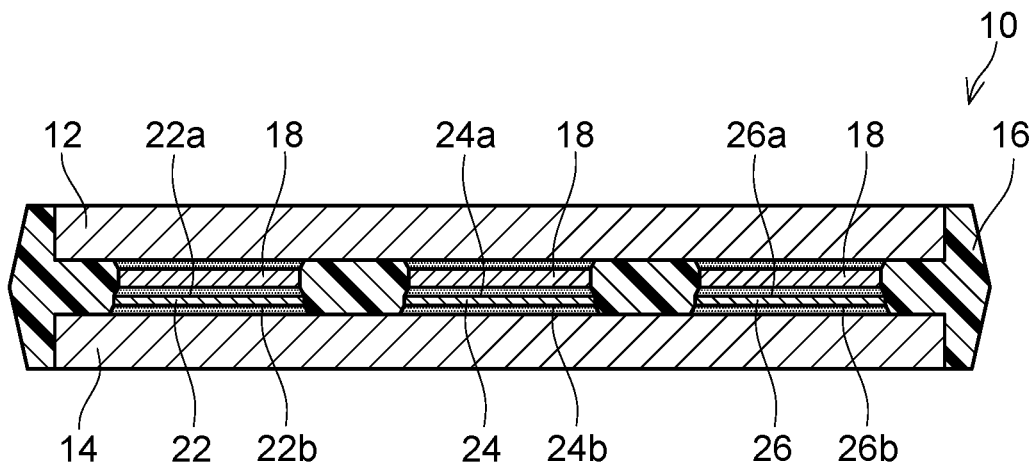
FIG. 2 shows a cross-sectional structure of the semiconductor device 10.
Figure 3:
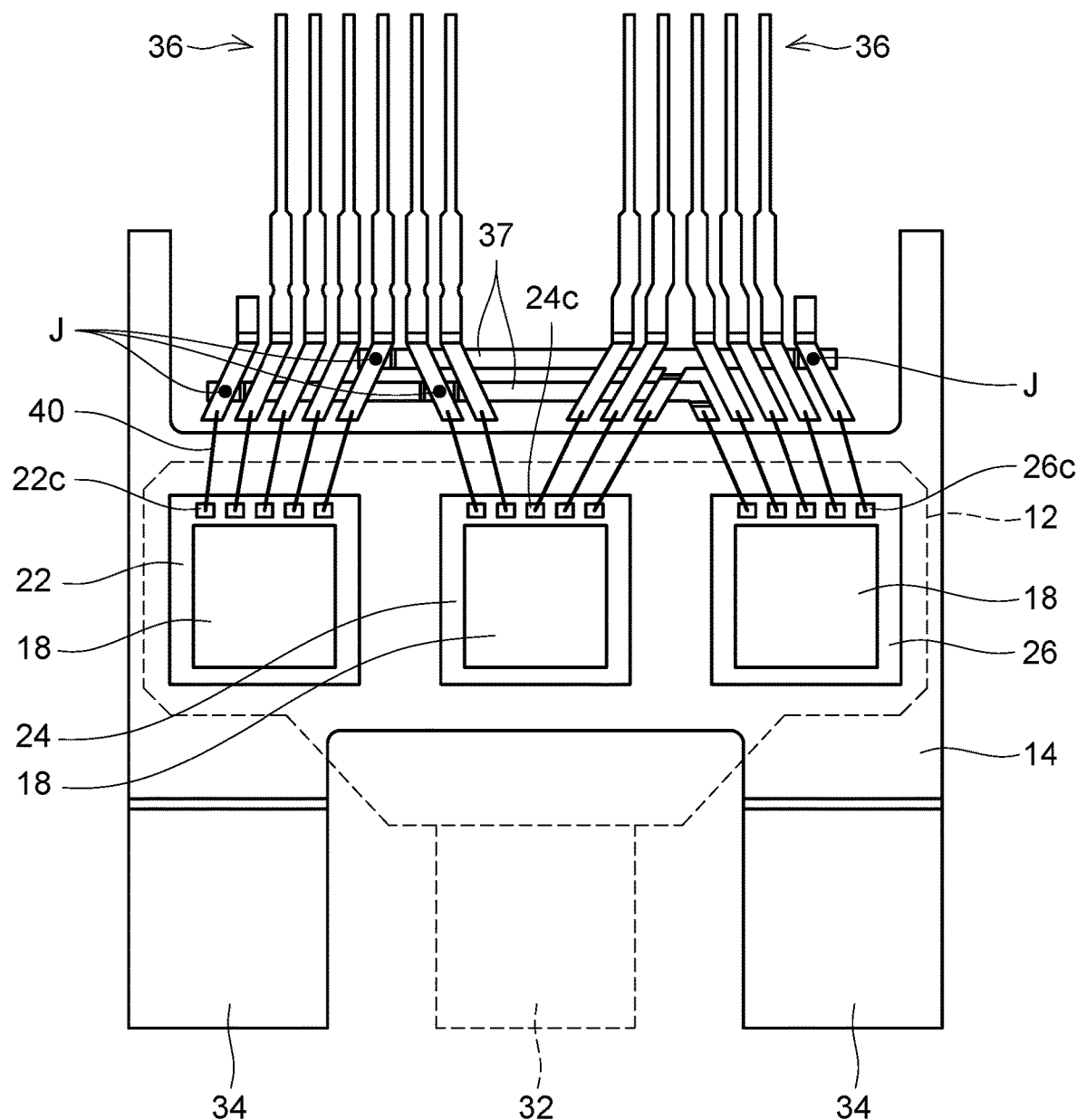
FIG. 3 is a plan view showing an internal structure of the semiconductor device 10 with an encapsulant 16 omitted.
Figure 4:
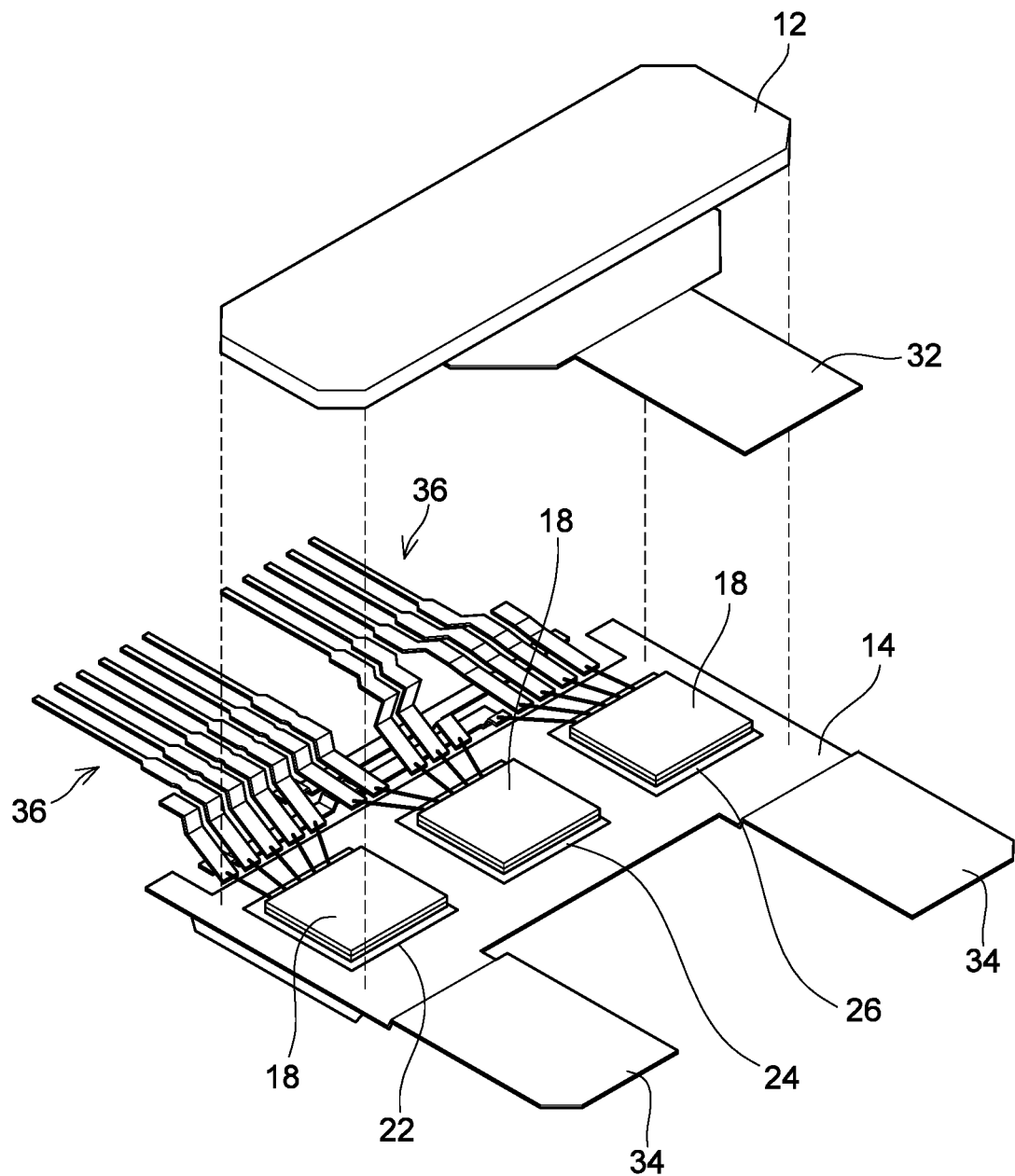
FIG. 4 is an exploded view showing the internal structure of the semiconductor device 10 with the encapsulant 16 omitted.

In an embodiment of the present technology, the common signal terminal may comprise a lateral extending portion within the encapsulant, the lateral extending portion extending along a direction in which the plurality of signal terminals is arranged. Such a configuration allows the common signal terminal to be in proximity to or be in contact with the plurality of signal electrodes arranged apart from one another.

In the embodiment above, the lateral extending portion may extend to an opposite side of one of the signal terminals next to the common signal terminal. Such a configuration allows the common signal terminal to be in proximity to or be in contact with two of the signal electrodes between which another signal electrode is interposed.

In the embodiment above, the lateral extending portion may cross over or under the one of the signal terminals next to the common signal terminal. Such a configuration enables the lateral extending portion to be provided within the encapsulant, without increasing a size of the semiconductor device.

Alternatively, the lateral extending portion may be located between the one of the signal terminals next to the common signal terminal and the first or second semiconductor element connected with the one of the signal terminals next to the common signal terminal. Such a configuration enables the plurality of signal terminals including the common signal terminal to be formed from a single conductor plate (e.g., a lead frame) since the lateral extending portion of the common signal terminal does not overlap the one of the signal terminals next to the common signal terminal in the configuration.

In an embodiment of the present technology, the semiconductor device may further comprise a supporting portion connected with the lateral ex-tending portion within the encapsulant. In this case, the supporting portion may protrude from the encapsulant between the first signal terminal and the second signal terminal. When the encapsulant is formed, such a configuration enables the lateral extending portion to be supported via the supporting portion from an outside of the encapsulant.

In an embodiment of the present technology, the semiconductor device may further comprise a third semiconductor element comprising a plurality of signal electrodes and encapsulated within the encapsulant. In this case, the common signal terminal may be further connected with one of the signal electrodes of the third semiconductor element within the encapsulant. As such, the common signal terminal may be shared among the signal electrodes of three or more semiconductor elements.

In an embodiment of the present technology, the first semiconductor element and the second semiconductor element may each comprise a temperature detector. Moreover, the plurality of signal electrodes of the first semiconductor element and the plurality of signal electrodes of the second semiconductor element may each comprise a first temperature signal electrode and a second temperature signal electrode. In each of the first semiconductor element and the second semiconductor element, the first temperature signal electrode may be connected with one end of the temperature detector, and the second temperature signal electrode may be connected with another end of the temperature detector. In this case, the first signal terminal may be connected with the first temperature signal electrode of the first semiconductor element, and the second signal terminal may be connected with the first temperature signal electrode of the second semiconductor element. The common signal terminal may be connected with both the second temperature signal electrode of the first semiconductor element and the second temperature signal electrode of the second semiconductor element. Such a configuration enables signals from the temperature detectors of the plurality of semiconductor elements to be externally outputted, while reducing the number of the signal terminals by adopting the common signal terminal.

In an embodiment of the present technology, the first semiconductor element and the second semiconductor element may each comprise a current detector. Moreover, the plurality of signal electrodes of the first semiconductor element and the plurality of signal electrodes of the second semiconductor element may each comprise a current signal electrode and a reference voltage signal electrode. In each of the first semiconductor element and the second semiconductor element, the current signal electrode may be connected with one end of the current detector, and the reference voltage signal electrode may be configured to output a reference voltage for a signal outputted from the current signal electrode. In this case, the first signal terminal may be connected with the current signal electrode of the first semiconductor element, and the second signal terminal may be connected with the current signal electrode of the second semiconductor element. The common signal terminal may be connected with both the reference voltage signal electrode of the first semiconductor element and the reference voltage signal electrode of the second semiconductor element. Such a configuration enables currents that flow in the respective semiconductor elements to be detected from the signals outputted from the current detectors of the plurality of semiconductor elements, while reducing the number of the signal terminals by adopting the common signal terminal.

In an embodiment of the present technology, each of the first semiconductor element and the second semiconductor element may be a switching element comprising a gate. Moreover, the plurality of signal electrodes of the first semiconductor element and the plurality of signal electrodes of the second semiconductor element may each comprise a gate signal electrode connected with its corresponding gate. In this case, the common signal terminal may be connected with the gate signal electrode of the first semiconductor element and the gate signal electrode of the second semiconductor element within the encapsulant. Such a configuration enables simultaneous control of the plurality of semiconductor elements by a common signal, while reducing the number of the signal terminals by adopting the common signal terminal.

Representative, non-limiting examples of the present invention will now be described in farther detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

With reference to the drawings, a semiconductor device 10 in an embodiment will be described. The semiconductor device 10 can be adopted for a power conversion circuit such as a converter or an inverter, for example, in an electric vehicle. The electric vehicle herein broadly refers to vehicles each including a motor that drives wheels. Examples of the electric vehicle include an electric vehicle charged with external power, a hybrid vehicle that includes an engine in addition to a motor, a fuel-cell vehicle powered by a fuel cell, and the like.

As shown in FIGS. 1 to 4, the semiconductor device 10 includes a first conductor plate 12, a second conductor plate 14, a plurality of semiconductor elements 22, 24, 26, and an encapsulant 16. The first conductor plate 12 and the second conductor plate 14 are parallel to each other, and are opposed to each other. As an example, the plurality of semiconductor elements 22, 24, 26 includes a first semiconductor element 22, a second semiconductor element 24, and a third semiconductor element 26. The second semiconductor element 24 is located between the first semiconductor element 22 and the third semiconductor element 26, and the plurality of semiconductor elements 22, 24, 26 is arranged along a longitudinal direction of the first conductor plate 12 and the second conductor plate 14 (a night-left direction in FIGS. 2 and 3). The plurality of semiconductor elements 22, 24, 26 is disposed in parallel between the first conductor plate 12 and the second conductor plate 14. The plurality of semiconductor elements 22, 24, 26 is encapsulated by the encapsulant 16.

Each of the first conductor plate 12 and the second conductor plate 14 is constituted of a conductor such as copper or another metal. The first conductor plate 12 and the second conductor plate 14 are opposed to each other with the plurality of semiconductor elements 22, 24, 26 interposed therebetween. Each of the semiconductor elements 22, 24, 26 is joined not only to the first conductor plate 12 but also to the second conductor plate 14. A conductor spacer 18 is provided between each of the semiconductor elements 22, 24, 26 and the first conductor plate 12. Here, a specific configuration of each of the first conductor plate 12 and the second conductor plate 14 is not particularly limited. For example, at least one of the first conductor plate 12 and the second conductor plate 14 may be an insulated substrate that includes an intermediate layer constituted of an insulator (e.g., ceramic), such as a Direct Bonded Copper (DBC) substrate. In other words, each of the first conductor plate 12 and the second conductor plate 14 may not necessarily be constituted of a conductor entirely.

The first semiconductor element 22, the second semiconductor element 24, and the third semiconductor element 26 are each a so-called power semiconductor element for a power circuit, and have an identical configuration. The first semiconductor element 22 includes an upper electrode 22a, a lower electrode 22b, and a plurality of signal electrodes 22c. The upper electrode 22a and the lower electrode 22b are each an electrode for power, and the signal electrodes 22c are each an electrode for signal. The upper electrode 22a and the plurality of signal electrodes 22c are located on an upper surface of the first semiconductor element 22, and the lower electrode 22b is located on a lower surface of the first semiconductor element 22. The upper electrode 22a is electrically connected with the first conductor plate 12 via the conductor spacer 18, and the lower electrode 22b is electrically connected with the second conductor plate 14. Similarly, the second semiconductor element 24 and the third semiconductor element 26 respectively include upper electrodes 24a, 26a, lower electrodes 24b, 26b, and pluralities of signal electrodes 24c, 26c. The upper electrodes 24a, 26a are electrically connected with the first conductor plate 12 via the conductor spacers 18, and the lower electrodes 24b, 26b are electrically connected with the second conductor plate 14.

As an example, the semiconductor elements 22, 24, 26 in the present embodiment are each an insulated Gate Bipolar Transistor (IGBT) including a gate, an emitter, and a collector. The emitters of the IGBTs are respectively connected with the upper electrodes 22a, 24a, 26a, and the collectors of the IGBTs are respectively connected with the lower electrodes 22b, 24b, 26b. It should be noted that a specific type and structure of the semiconductor elements 22, 24, 26 are not particularly limited. The semiconductor elements 22, 24, 26 may each be a Reverse Conducting (RC)-IGBT element further including a diode structure. Alternatively, the semiconductor elements 22, 24, 26 may each be, for example, a Metal-Oxide-Semiconductor Field-Effect Transistor (MOSFET), in place of or in addition to the IGBT. Moreover, a semiconductor material used for the semiconductor elements 22, 24, 26 is not particularly limited, and may be, for example, silicon (Si), silicon carbide (SiC), or a nitride semiconductor such as gallium nitride (GaN).

The encapsulant 16 can be constituted of, for example, a thermosetting resin such as epoxy resin or another insulator, although not particularly limited thereto. The encapsulant 16 may also be termed, for example, a molded resin or a package. The semiconductor device 10 may include only two semiconductor elements or more than three semiconductor elements, instead of including the three semiconductor elements 22, 24, 26. In this case as well, the plurality of semiconductor elements 22, 24, 26 can be encapsulated by the single encapsulant 16, and can be disposed in parallel or in series between the first conductor plate 12 and the second conductor plate 14.

The first conductor plate 12 and the second conductor plate 14 are not only electrically connected with the plurality of semiconductor elements 22, 24, 26 but also thermally connected therewith. Moreover, the first conductor plate 12 and the second conductor plate 14 are respectively exposed at surfaces of the encapsulant 16, and can dissipate heat of the respective semiconductor elements 22, 24, 26 to an outside of the encapsulant 16. The semiconductor device 10 in the present embodiment thereby has a double-sided cooling structure in which heat-dissipating plates are disposed on both sides of each of the semiconductor elements 22, 24, 26.

The semiconductor device 10 further includes a first power terminal 32 and two second power terminals 34. Each of the power terminals 32, 34 is constituted of a conductor such as copper or aluminum. Each of the power terminals 32, 34 is a so-called lead, and extends from an inside to the outside of the encapsulant 16. The first power terminal 32 is connected with the first conductor plate 12 within the encapsulant 16. Each of the second power terminals 34 is connected with the second conductor plate 14 within the encapsulant 16. The plurality of semiconductor elements 22, 24, 26 is thereby electrically connected in parallel between the first power terminal 32 and each of the second power terminals 34. As an example, the first power terminal 32 is joined to the first conductor plate 12 by soldering, and each of the second power terminals 34 is configured integrally with the second conductor plate 14. The first power terminal 32 may be configured integrally with the first conductor plate 12. Moreover, each of the second power terminals 34 may be joined to the second conductor plate 14, for example, by soldering.

The semiconductor device 10 further includes a plurality of signal terminals 36. Each of the signal terminals 36 is constituted of a conductor such as copper or aluminum. Each of the signal terminals 36 is a so-called lead, and extends from the inside to the outside of the encapsulant 16. The plurality of signal terminals 36 is arranged along a longitudinal direction of the encapsulant 16 (the right-left direction in FIGS. 2 and 3), and protrudes from the encapsulant 16 in a same direction. As an example, the semiconductor device 10 in the present embodiment includes eleven signal terminals 36. The plurality of signal terminals 36 is, within the encapsulant 16, connected with the plurality of signal electrodes 22c, 24c, 26c of the semiconductor elements 22, 24, 26 via bonding wires 40. The plurality of signal terminals 36 may be connected directly with the plurality of signal electrodes 22c, 24c, 26c, without intervention of the bonding wires 40.

Figure 5:
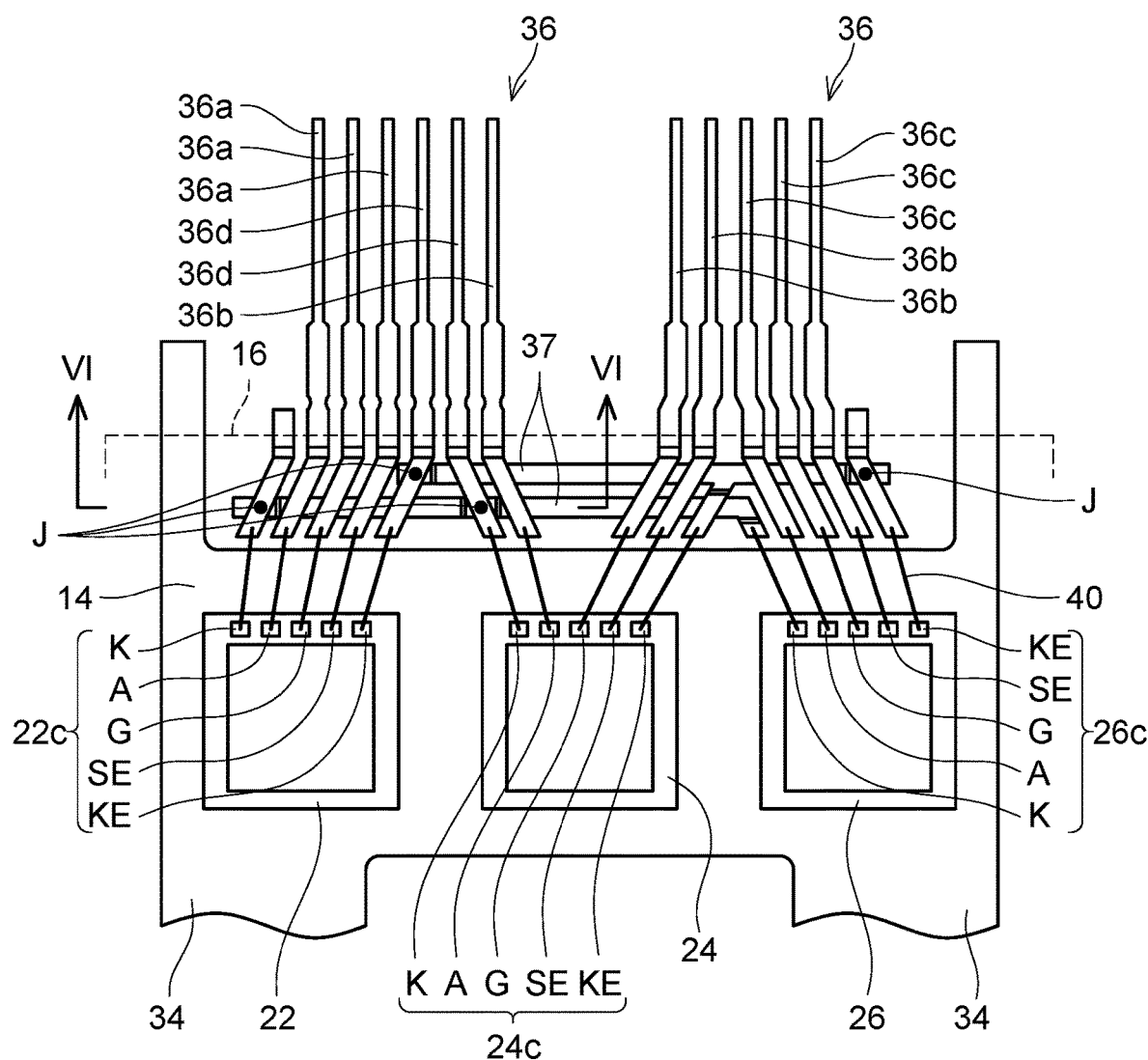
FIG. 5 shows connection portions between signal electrodes 22c, 24c, 26c of semiconductor elements 22, 24, 26 and a plurality of signal terminals 36.

As shown in FIG. 5, the plurality of signal terminals 36 includes first signal terminals 36a, second signal terminals 36b, third signal terminals 36c, and common signal terminals 36d. Each of the first signal terminals 36a is connected with one of the plurality of signal electrodes 22c of the first semiconductor element 22 within the encapsulant 16. Each of the second signal terminals 36b is connected with one of the plurality of signal electrodes 24c of the second semiconductor element 24 within the encapsulant 16. Each of the third signal terminals 36c is connected with one of the plurality of signal electrodes 26c of the third semiconductor element 26 within the encapsulant 16. Each of the common signal terminals 36d is connected with three signal electrodes, namely, one of the plurality of signal electrodes 22c of the first semiconductor element 22, one of the plurality of signal electrodes 24c of the second semiconductor element 24, and one of the plurality of signal electrodes 26c of the third semiconductor element 26, within the encapsulant 16. In other words, each of the common signal terminals 36d is connected with the signal electrodes 22c, 24c, 26c of the semiconductor elements 22, 24, 26.

In the semiconductor device 10 in the present embodiment, the plurality of signal terminals 36 includes the common signal terminals 36d connected with the signal electrodes 22c, 24c, 26c of the plurality of semiconductor elements 22, 24, 26. Such a configuration can reduce the number of the signal terminals 36 required relative to the total number of the signal electrodes 22c, 24c, 26c of the plurality of semiconductor elements 22, 24, 26. Here, to minimize the number of the signal terminals 36, it is can be considered to replace all of the plurality of signal terminals 36 with the common signal terminals 36d that are shared among the semiconductor elements 22, 24, 26. However, replacing all of the plurality of signal terminals 36 with the common signal terminals 36d makes it impossible to individually communicate with the respective semiconductor elements 22, 24, 26. In view of this, in the semiconductor device 10 in the present embodiment, the plurality of signal terminals 36 further includes the first signal terminals 36a connected only with the signal electrodes 22c of the first semiconductor element 22, the second signal terminals 36b connected only with the signal electrodes 24c of the second semiconductor element 24, and the third signal terminals 36c connected only with the signal electrodes 26c of the third semiconductor element 26. Due to this, the number of the signal terminals 36 required as a whole can be reduced, while individual communication paths to the respective semiconductor elements 22, 24, 26 are maintained.

Figure 6:
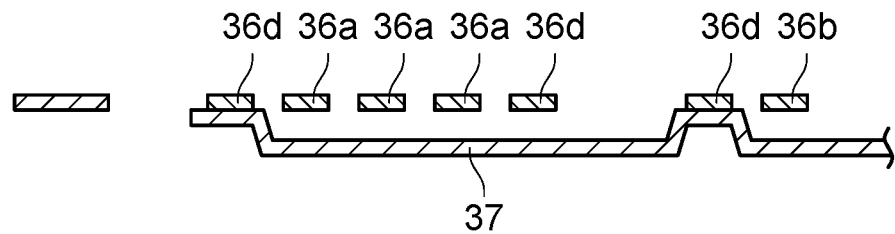
FIG. 6 is a cross-sectional view along a line VI-VI in FIG. 5.

As shown in FIGS. 5 and 6, each of the common signal terminals 36d includes a lateral extending portion 37 extending in a direction along which the plurality of signal terminals 36 is arranged, within the encapsulant 16. Such a configuration allows the common signal terminals 36d to be in proximity to or be in contact with the plurality of signal electrodes 22c, 24c, 26c disposed apart from one another. Moreover, each of the lateral extending portions 37 forms an angle relative to the direction along Which its corresponding common signal terminal 36d protrudes from the encapsulant 16, and hence can also function as an anchor that firmly fixes the common signal terminal 36d to the encapsulant 16. Points J in FIG. 5 each indicate a junction point in the common signal terminals 36d, and some conductor pieces that constitute each of the common signal terminals 36d are mutually joined at the junction points J. The same applies to the other drawings, and the points J each indicate a junction point in the common signal terminals 36d.

Each of the lateral extending portions 37 extends to an opposite side of one of the signal terminals next to its corresponding common signal terminal 36d. Such a configuration allows each of the common signal terminals 36d to be proximity to or be in contact with the signal electrodes 22c, 24c, 26c among which the other signal electrodes 22c, 24c, 26c are interposed. As an example, each of the lateral extending portions 37 in the present embodiment crosses over or under the signal terminals 36a, 36b next to its corresponding common signal terminal 36d (see FIG. 6). In other words, each of the lateral extending portions 37 crosses above or below the other signal terminal(s) 36 next to its corresponding common signal terminal 36d with a space maintained therebetween. Such a configuration enables the lateral extending portions 37 to be provided within the encapsulant 16, without increasing the size of the semiconductor device 10.

In the semiconductor device 10 in the present embodiment, the common signal terminals 36d each are shared among the three semiconductor elements 22, 24, 26. However, the common signal terminals 36d each may be shared only among two semiconductor elements (e.g., the first semiconductor element 22 and the second semiconductor element 24). Alternatively, in a case where the semiconductor device 10 includes more than three semiconductor elements, the common signal terminals 36d each may be shared among more than four semiconductor elements.

Figure 7:
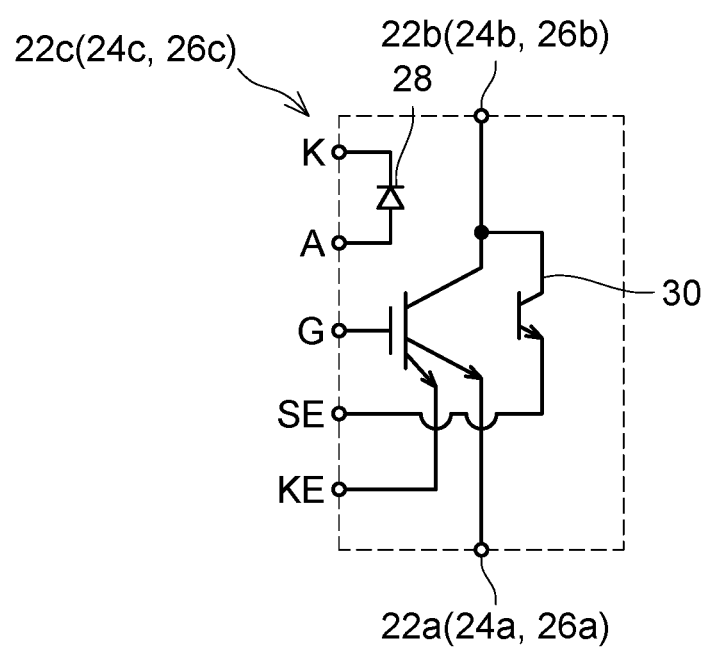
FIG. 7 is a circuit diagram showing a configuration of each of the semiconductor elements 22, 24, 26.

The semiconductor elements 22, 24, 26 respectively include the plurality of signal electrodes 22c, the plurality of signal electrodes 24c, and the plurality of signal electrodes 26c that have different functions. In this respect, each of the common signal terminals 36d is not limited to be adopted for the signal electrodes 22c, 24c, 26c of a specific function, but can be adopted for the signal electrodes 22c, 24c, 26c of any function. As shown in FIGS. 5 and 7, the semiconductor elements 22, 24, 26 in the present embodiment each include a gate signal electrode G, a first temperature signal electrode A, a second temperature signal electrode K, a current signal electrode SE, and a reference voltage signal electrode KE, as the plurality of signal electrodes 22c, 24c, 26c described above. The common signal terminals 36d are adopted respectively for the second temperature signal electrodes K and for the reference voltage signal electrodes KE. On the other hand, dedicated signal terminals for each semiconductor element (e.g., the first signal terminals 36a, the second signal terminals 36b, and the third signal terminals 36c) are adopted for the gate signal electrodes G, the first temperature signal electrodes A, and the current signal electrodes SE.

The gate signal electrodes G are signal electrodes into which gate drive signals for the semiconductor elements 22, 24, 26 are inputted, respectively. The gate signal electrodes U are respectively connected with the gates of the semiconductor elements 22, 24, 26 (the gates of the IGBTs in the present embodiment). The gate signal electrode G of the first semiconductor element 22 is connected with one of the first signal terminals 36a. The gate signal electrode G of the second semiconductor element 24 is connected with one of the second signal terminals 36b. The gate signal electrode G of the third semiconductor element 26 is connected with one of the third signal terminals 36c. As such, when the different signal terminals 36a, 36b, 36c are adopted for the gate signal electrodes G, different gate drive signals can be respectively provided to the semiconductor elements 22, 24, 26. Therefore, only one of or some of the three semiconductor elements 22, 24, 26, for example, can be operated selectively.

The first temperature signal electrodes A and the second temperature signal electrodes K are signal electrodes that output signals corresponding to temperatures of the semiconductor elements 22, 24, 26. In each of the semiconductor elements 22, 24, 26, the first temperature signal electrode A and the second temperature signal electrode K are connected with a temperature sensor 28. As an example, the temperature sensor 28 is a temperature sense diode. The first temperature signal electrode A is connected with an anode of the temperature sense diode, and the second temperature signal electrode K is connected with a cathode of the temperature sense diode. The first temperature signal electrode A of the first semiconductor element 22 is connected with one of the first signal terminals 36a. The first temperature signal electrode A of the second semiconductor element 24 is connected with one of the second signal terminals 36b. The first temperature signal electrode A of the third semiconductor element 26 is connected with one of the third signal terminals 36c. On the other hand, the second temperature signal electrodes K of the semiconductor elements 22, 24, 26 are connected with one of the common signal terminals 36d. Such a configuration enables a reference voltage (e.g., a ground voltage) to be supplied to each of the temperature sensors 28 of the plurality of semiconductor elements 22, 24, 26 via the common signal terminal 36d. Then, signals outputted from the respective temperature sensors 28 of the plurality of semiconductor elements 22, 24, 26 are individually outputted via the first signal terminal 36a, the second signal terminal 36b, and the third signal terminal 36c, respectively. As such, currents that flow respectively in the semiconductor elements 22, 24, 26 can be detected based on the respective signals outputted from the respective temperature sensors 28 of the plurality of semiconductor elements 22, 24, 26. While the common signal terminal 36d is adopted.

The current signal electrodes SE are signal electrodes that output signals corresponding to the currents that flow in the semiconductor elements 22, 24, 26, respectively. In each of the semiconductor elements 22, 24, 26, the current signal electrode SE is connected with a current sensor 30. As an example, the current sensor 30 in the present embodiment outputs a microcurrent that is proportional to the current flowing in corresponding one of the semiconductor elements 22, 24, 26. The reference voltage signal electrodes KE are respectively connected with the emitters of the IGBTs, and output voltages of the emitters of the IGBTs (these voltages are equal to voltages of the upper electrodes 22a, 24a, 26a) as reference voltages. These reference voltages are used as reference voltages when the signals outputted from the current signal electrodes SE are processed. The current signal electrode SE of the first semiconductor element 22 is connected with one of the first signal terminals 36a. The current signal electrode SE of the second semiconductor element 24 is connected with one of the second signal terminals 36b. The current signal electrode SE of the third semiconductor element 26 is connected with one of the third signal terminals 36c. On the other hand, the reference voltage signal electrodes KE of the semiconductor elements 22, 24, 26 are connected with another one of the common signal terminals 36d, According to such a configuration, currents that flow respectively in the semiconductor elements 22, 24, 26 can be detected based on the signals outputted from the current sensors 30 of the plurality of semiconductor elements 22, 24, 26, while the common signal terminal 36d is adopted.

Figure 8:
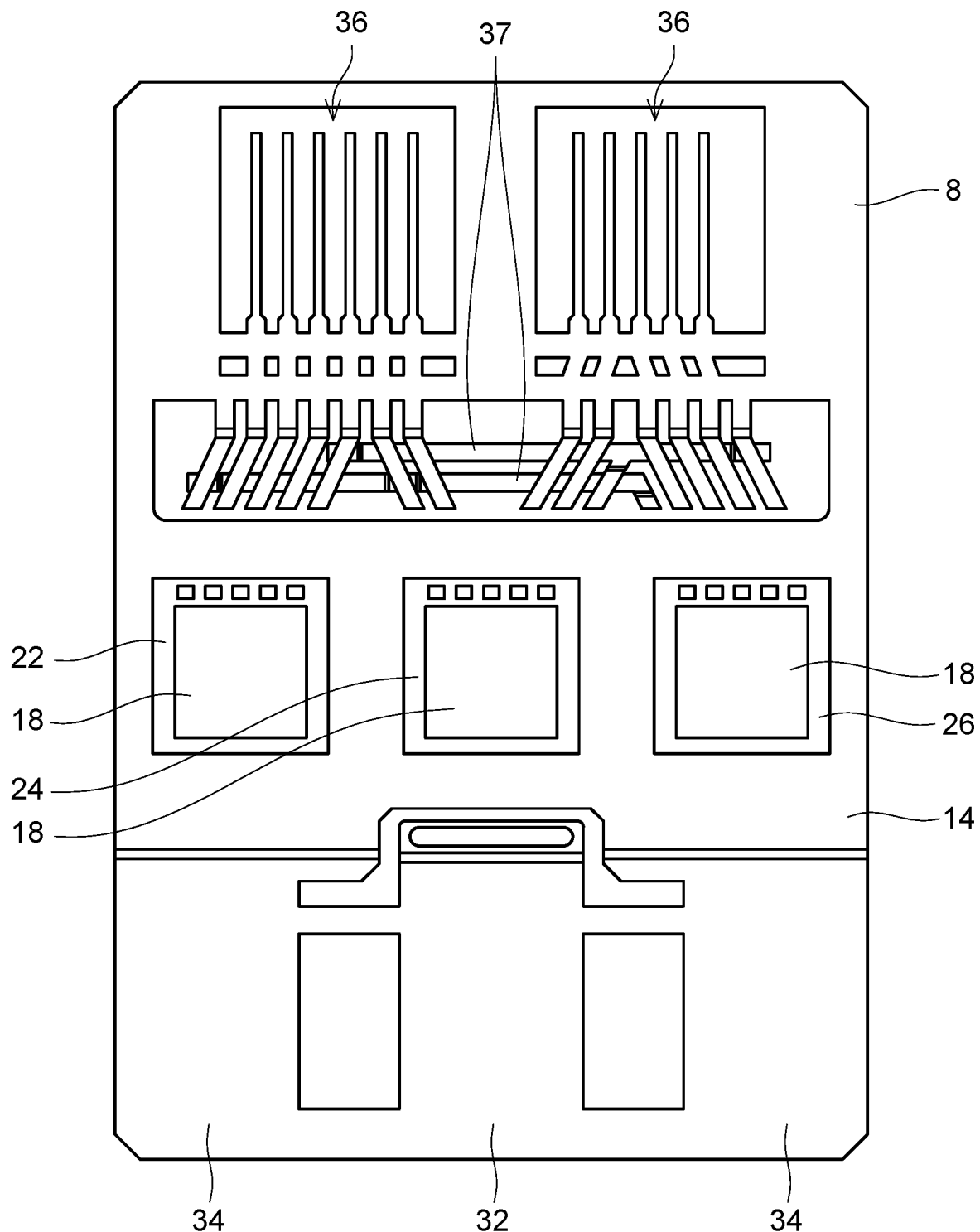
FIG. 8 shows a first reflow step in a method of manufacturing the semiconductor device 10.

Next, an example of a method of manufacturing the semiconductor device 10 will be described. In this manufacturing method, a first reflow step is executed as shown in FIG. 8. Firstly in the first reflow step, a lead frame 8 is prepared. The second conductor plate 14, the first power terminal 32, the two second power terminals 34, and the plurality of signal terminals 36 are integrally provided on the lead frame 8. Next, the plurality of semiconductor elements 22, 24, 26 is joined onto the second conductor plate 14 of the lead frame 8 together with the plurality of conductor spacers 18, for example, by soldering. A half-finished product shown in FIG. 8 is thereby completed.

Figure 9:
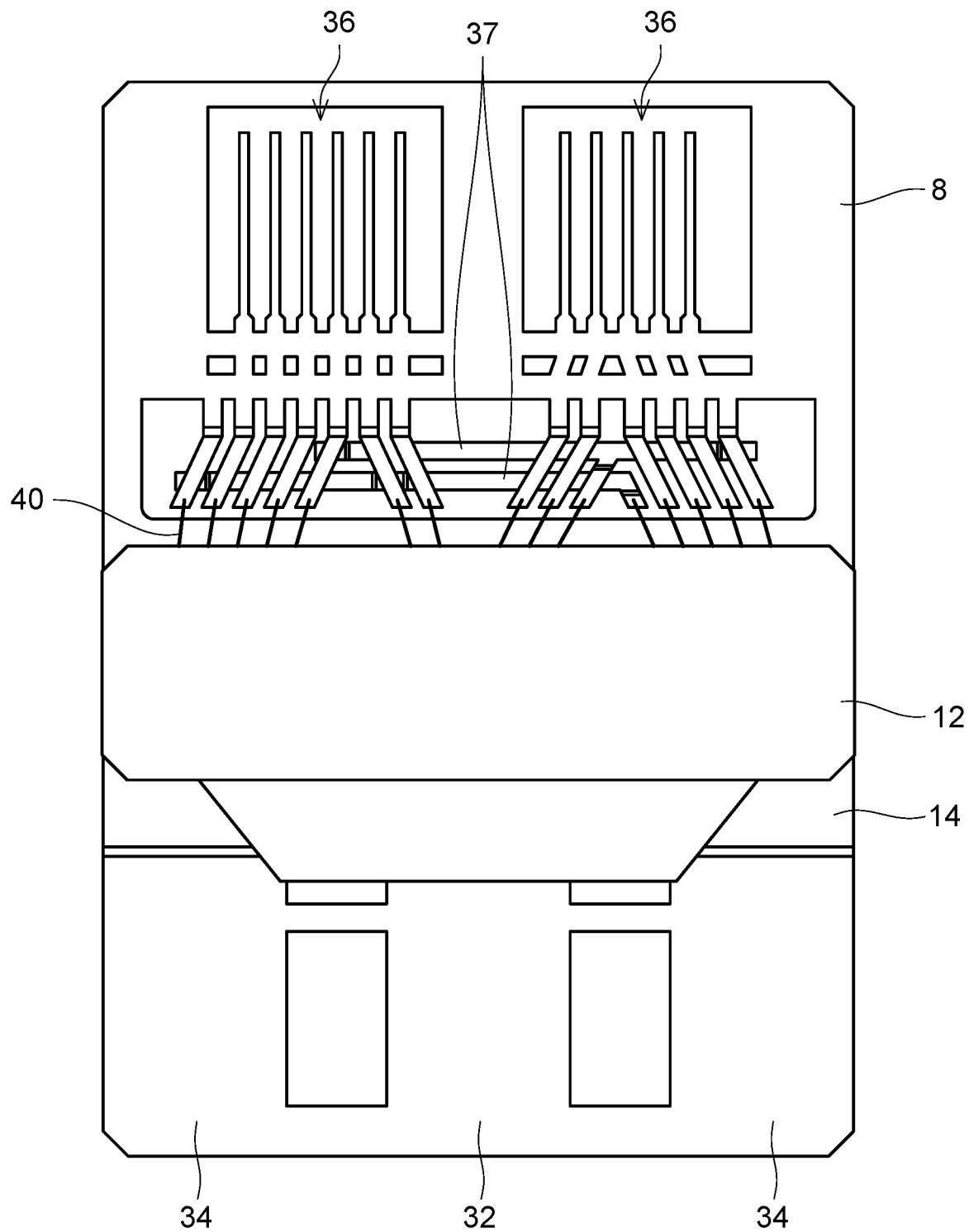
FIG. 9 shows a wire bonding step and a second reflow step in the method of manufacturing the semiconductor device 10.

Next, as shown in FIG. 9, a bonding step and a second reflow step are executed. In the bonding step, the plurality of signal terminals 36 of the lead frame 8 is connected with the signal electrodes 22c, 24c, 26c of the plurality of semiconductor elements 22, 24, 26, via the bonding wires 40. Next, in the second reflow step, the first conductor plate 12 is joined onto the plurality of conductor spacers 18, for example, by soldering. At this time, the first power terminal 32 of the lead frame 8 is also joined to the first conductor plate 12, for example, by soldering. A half-finished product shown in FIG. 9 is thereby completed.

Figure 10:
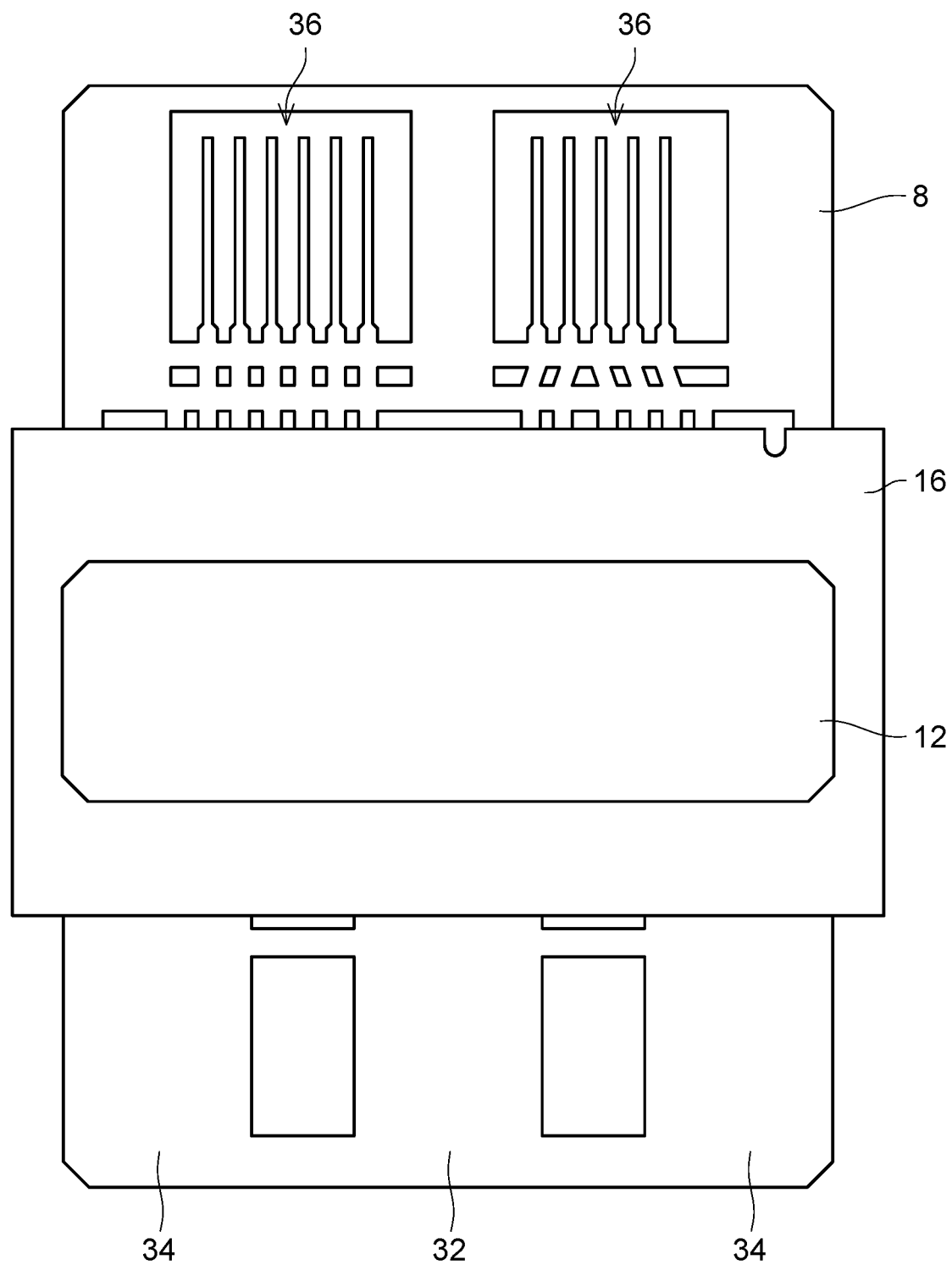
FIG. 10 shows a forming step for the encapsulant 16 in the method of manufacturing the semiconductor device 10.

Next, as shown in FIG. 10, a forming step for the encapsulant 16 is executed. In this forming step, the encapsulant 16 can be formed, for example, by insert molding. Subsequently, the surfaces of the encapsulant 16 are ground to thereby expose the first conductor plate 12 and the second conductor plate 14 at the surfaces of the encapsulant 16. A half-finished product shown in FIG. 10 is thereby completed. Subsequently, an unnecessary portion (a so-called tie bar) of the lead frame 8 is cut away to thereby complete the semiconductor device 10.

Figure 11:
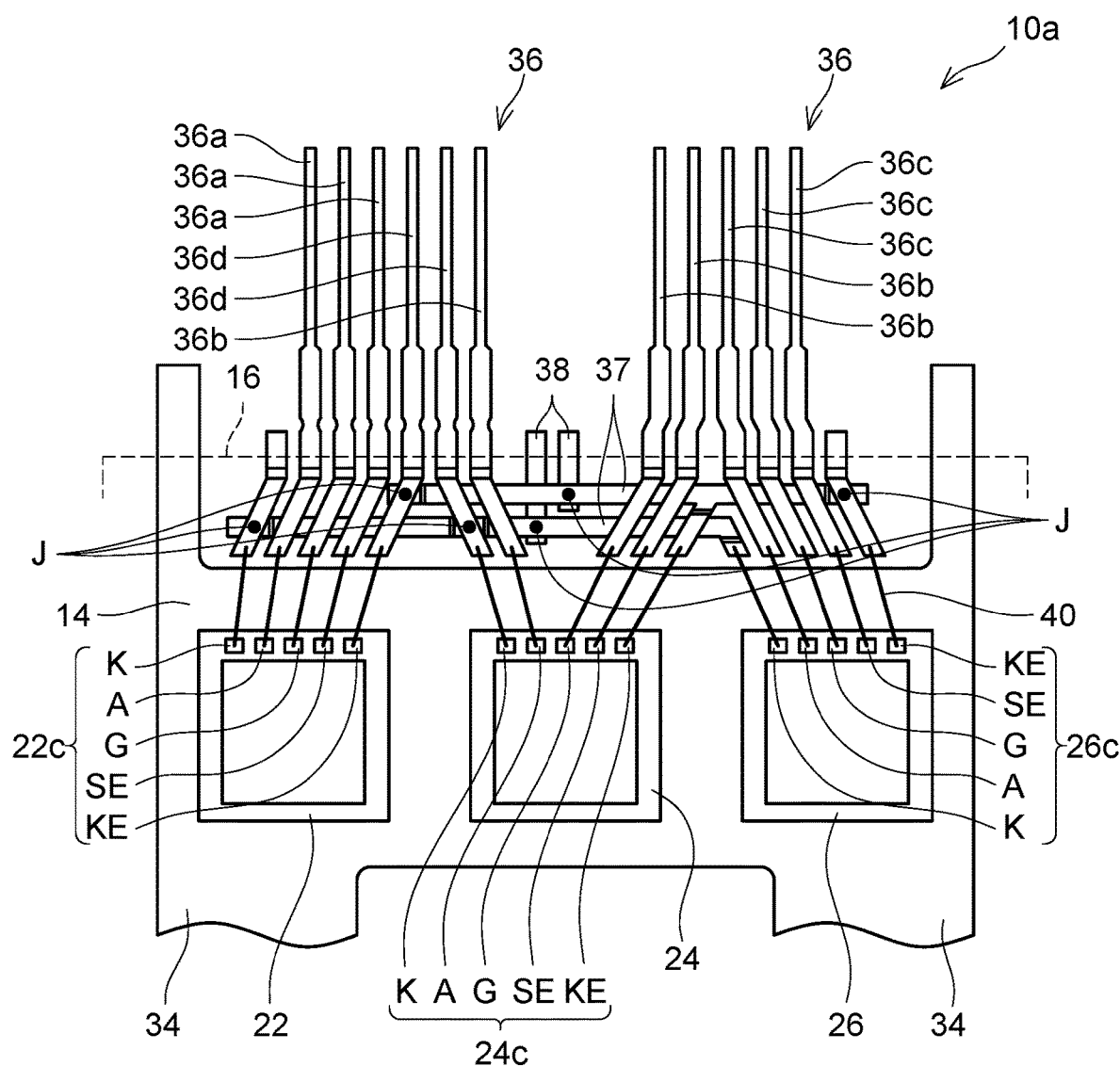
FIG. 11 shows a semiconductor device 10a of a variant.

Some variants of the semiconductor device 10 will hereinafter be described. FIG. 11 shows a semiconductor device 10a in a variant. In comparison with the semiconductor device 10 described above, this semiconductor device 10a additionally includes supporting portions 38. For other configurations, the semiconductor device 10a is identical to the semiconductor device 10 described above. The supporting portions 38 are connected with the lateral extending portions 37 respectively, within the encapsulant 16. Each of the supporting portions 38 extends in a direction that forms an angle relative to its corresponding lateral extending portion 37, and protrudes from the encapsulant 16 between the plurality of signal terminals. When the encapsulant 16 is formed, such a configuration enables the lateral extending portions 37 to be supported via the supporting portions 38 from the outside of the encapsulant 16. Such supporting portions 38 can be provided, for example, at the lead frame 8 described above.

Figure 12:
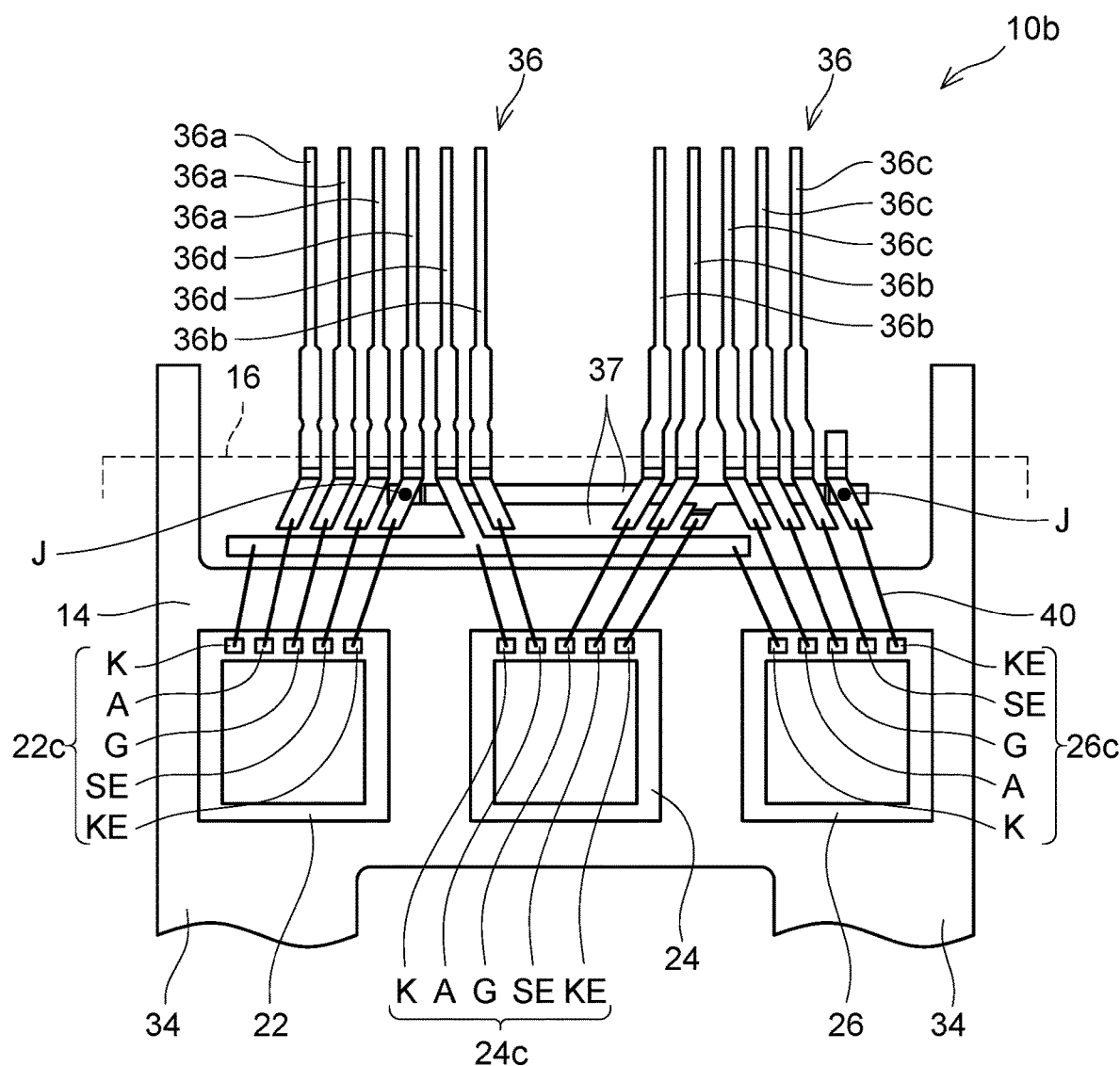
FIG. 12 shows a semiconductor device 10b of another variant.

FIG. 12 shows a semiconductor device 10b in another variant. In comparison with the semiconductor device 10 described above, this semiconductor device 10b has a modified configuration for one of the common signal terminals 36d. For other configurations, the semiconductor device 10b is identical to the semiconductor device 10 described above. As shown in FIG. 12, the modified common signal terminal 36*d* may be located between the signal terminals 36*a*, 36*b* next to the modified common signal terminal 36*d* and the semiconductor elements 22, 24 connected with the signal terminals 36*a*, 36*b* next to the modified common signal terminal 36*d*. According to such a configuration, the lateral extending portion 37 of the modified common signal terminal 36*d* does not overlap the signal terminals 36*a*, 36*b* next to the the modified common signal terminal 36*d*, and hence the plurality of signal terminals 36 including the modified common signal terminals 36*d* can be configured from a single conductor plate (e.g., the lead frame 8).

Figure 13:
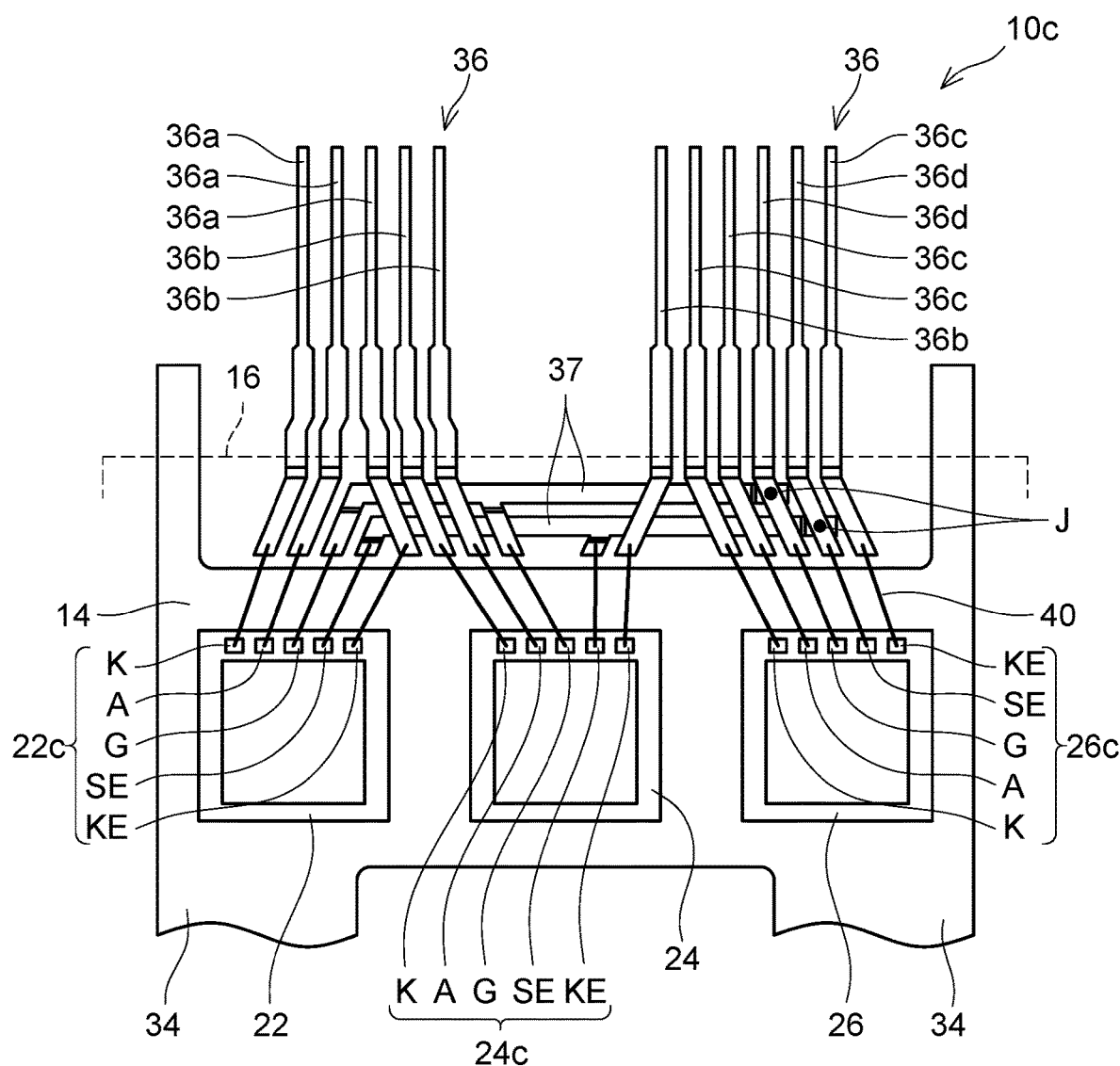
FIG. 13 shows a semiconductor device 10c of still another variant.

FIG. 13 shows a semiconductor device 10*c* in still another variant. This semiconductor device 10*c* differs from the semiconductor device 10 described above in that the common signal terminals 36*d* are adopted for the gate signal electrodes G and the current signal electrodes SE. For other configurations, the semiconductor device 10*c* is identical to the semiconductor device 10 described above. One of the common signal terminals 36*d* is connected with the gate signal electrodes G of the plurality of semiconductor elements 22, 24, 26. Such a configuration enables simultaneous control for the plurality of semiconductor elements 22, 24, 26 with a common gate drive signal, while reducing the number of the signal terminals 36 by adopting the common signal terminals 36*d*. Another one of the common signal terminals 36*d* is connected with the current signal electrodes SE of the plurality of semiconductor elements 22, 24, 26. According to such a configuration, a signal outputted from this common signal terminal 36*d* corresponds to a sum of the currents that flow in the plurality of semiconductor elements 22, 24, 26. Assuming that the currents that flow in the plurality of semiconductor elements 22, 24, 26 are equal to each other, the respective currents that flow in the semiconductor elements 22, 24, 26 can be estimated based on the signal outputted from this common signal terminal 36*d*.

What is claimed is:

1. A semiconductor device comprising:
   a first semiconductor element comprising a plurality of first signal electrodes;
   a second semiconductor element comprising a plurality of second signal electrodes;
   an encapsulant encapsulating the first semiconductor element and the second semiconductor element; and
   a plurality of signal terminals protruding from the encapsulant, the plurality of signal terminals comprising:
      a first signal terminal connected to one of the first signal electrodes within the encapsulant;
      a second signal terminal connected to one of the second signal electrodes within the encapsulant; and
      a common signal terminal that is, within the encapsulant, connected to another one of the first signal electrodes and another one of the second signal electrodes.

2. The semiconductor device according to claim 1, wherein the common signal terminal comprises a laterally extending portion within the encapsulant, the encapsulant at least partly surrounding the laterally extending portion and the laterally extending portion extending along a direction in which the plurality of signal terminals is arranged.

3. The semiconductor device according to claim 2, wherein the laterally extending portion extends to an opposite side of one of the signal terminals, the one of the signal terminals being located next to the common signal terminal in the direction.

4. The semiconductor device according to claim 3, wherein the laterally extending portion crosses over or under the one of the signal terminals.

5. The semiconductor device according to claim 3, wherein the laterally extending portion is located between the one of the signal terminals next to the common signal terminal and the first or second semiconductor element connected to the one of the signal terminals next to the common signal terminal.

6. The semiconductor device according to claim 2, further comprising a supporting portion connected to the laterally extending portion within the encapsulant,
   wherein the first signal terminal protrudes from a first point on a surface of the encapsulant, the second signal terminal protrudes from a second point on the surface of the encapsulant, the supporting portion protrudes from a third point on the surface of the encapsulant, and the third point is located between the first point and the second point in the direction.

7. The semiconductor device according to claim 1, further comprising a third semiconductor element comprising a plurality of signal electrodes and encapsulated within the encapsulant,
   wherein the common signal terminal is further connected to one of the signal electrodes of the third semiconductor element within the encapsulant.

8. The semiconductor device according to claim 1,
   wherein the first semiconductor element and the second semiconductor element each comprise a temperature detector,
   the plurality of signal electrodes of the first semiconductor element and the plurality of signal electrodes of the second semiconductor element each comprise a first temperature signal electrode and a second temperature signal electrode,
   in each of the first semiconductor element and the second semiconductor element, the first temperature signal electrode is connected to one end of the temperature detector, and the second temperature signal electrode is connected to another end of the temperature detector,
   the first signal terminal is connected to the first temperature signal electrode of the first semiconductor element,
   the second signal terminal is connected to the first temperature signal electrode of the second semiconductor element, and
   the common signal terminal is connected to both the second temperature signal electrode of the first semiconductor element and the second temperature signal electrode of the second semiconductor element.

9. The semiconductor device according to claim 1,
   wherein the first semiconductor element and the second semiconductor element each comprise a current detector,
   the plurality of first signal electrodes and the plurality of second signal electrodes each comprise a current signal electrode and a reference voltage signal electrode,
   in each of the first semiconductor element and the second semiconductor element, the current signal electrode is connected to one end of the current detector, and the reference voltage signal electrode is configured to output a reference voltage for a signal outputted from the current signal electrode,
   the first signal terminal is connected to the current signal electrode of the first semiconductor element,
   the second signal terminal is connected to the current signal electrode of the second semiconductor element, and the common signal terminal is connected to both the reference voltage signal electrode of the first semiconductor element and the reference voltage signal electrode of the second semiconductor element.

10. The semiconductor device according to claim 1, wherein each of the first semiconductor element and the second semiconductor element is a switching element comprising a gate, the plurality of first signal electrodes and the plurality of second signal electrodes each comprise a gate signal electrode connected to the gate of corresponding one of the first semiconductor element or the second semiconductor element, and the common signal terminal is connected to both the gate signal electrode of the first semiconductor element and the gate signal electrode of the second semiconductor element within the encapsulant.

\* \* \* \* \*